United States Patent
Kenmoku

(10) Patent No.: US 6,281,966 B1
(45) Date of Patent: *Aug. 28, 2001

(54) EXPOSURE APPARATUS AND DEVICE MANUFACTURING METHOD

(75) Inventor: Hiromi Kenmoku, Kanuma (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/257,928

(22) Filed: Feb. 26, 1999

(30) Foreign Application Priority Data

Feb. 27, 1998 (JP) ................................. 10-061900

(51) Int. Cl.⁷ ................................................... G03B 27/52
(52) U.S. Cl. ............................................. 355/55; 355/53
(58) Field of Search ................................. 355/55, 53, 67, 355/77; 356/399, 400, 401; 250/548

(56) References Cited

U.S. PATENT DOCUMENTS

| 5,117,254 | * | 5/1992 | Kawashima et al. | 355/43 |
| 5,137,349 | * | 8/1992 | Taniguchi et al. | 353/122 |
| 5,268,744 | * | 12/1993 | Mori et al. | 356/400 |
| 5,489,966 | * | 2/1996 | Kawashima et al. | 355/43 |
| 5,661,548 | * | 8/1997 | Imai | 355/55 |
| 5,825,043 | * | 10/1998 | Suwa | 250/548 |
| 5,883,704 | * | 3/1999 | Nishi et al. | 355/67 |
| 5,929,454 | * | 7/1999 | Muraki et al. | 250/491.1 |

FOREIGN PATENT DOCUMENTS 2-105514    4/1990    (JP) .

* cited by examiner

*Primary Examiner*—Safet Metjahic
*Assistant Examiner*—Etienne LeRoux
(74) *Attorney, Agent, or Firm*—Fitzpatrick, Cella, Harper & Scinto

(57) ABSTRACT

An exposure apparatus with an autofocus control system, wherein a focusing mark formed on an original is illuminated with light of the same wavelength as that of exposure light, so that an image thereof is projected through a projection optical system onto a reflection surface provided at a predetermined position on a substrate stage, wherein the light reflected therefrom is received through the projection optical system and the original, and wherein this operation is repeated at different positions along an optical axis direction, an the basis of which the image plane position of the projection optical system is detected. During this projection, the substrate stage is moved continuously along the optical axis direction, and at different positions the reflection surface is detected while, on the other hand, reflected light from the focusing mark image is received by a light receiving system, in synchronized timing.

16 Claims, 7 Drawing Sheets

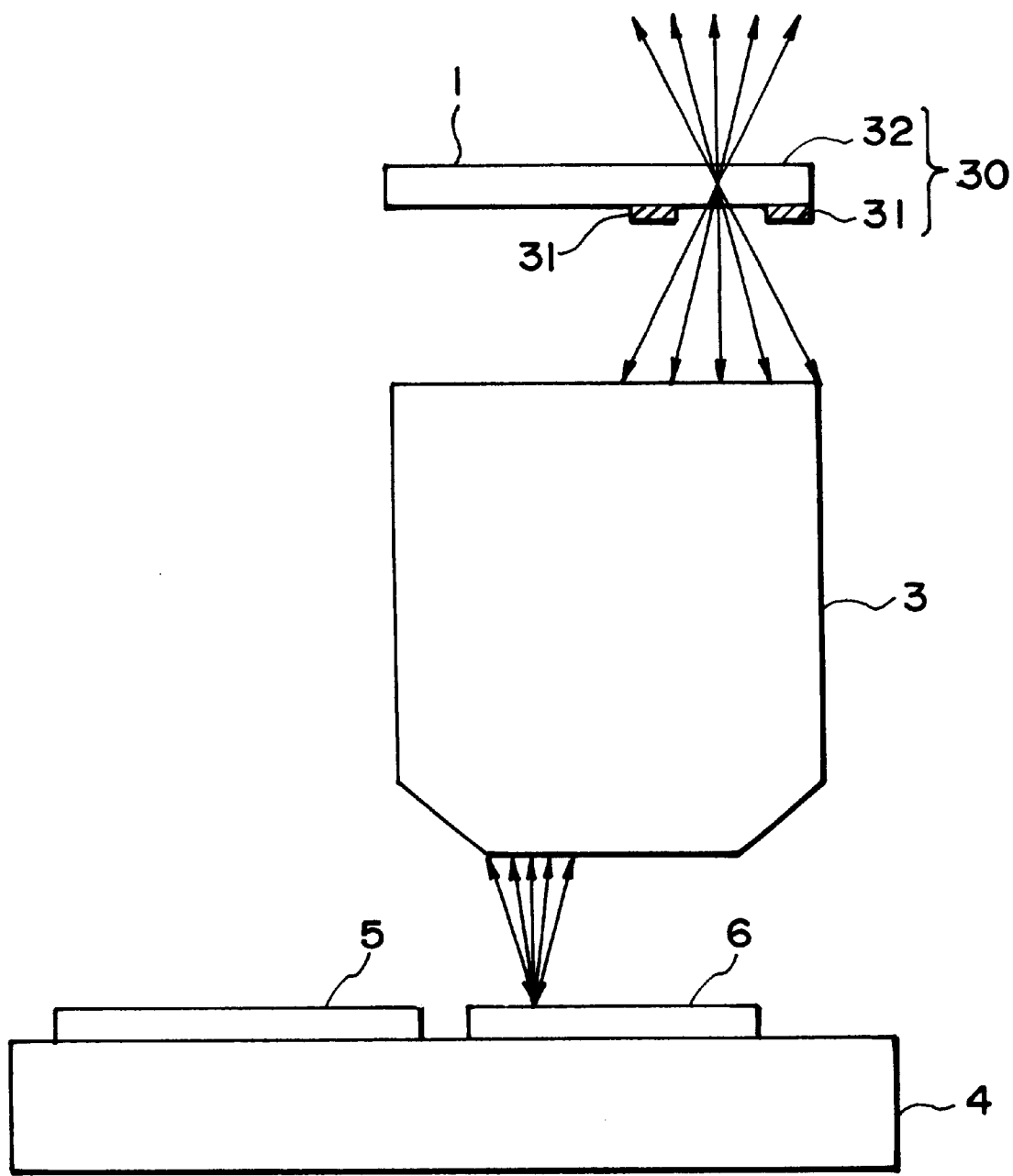
F I G. 2

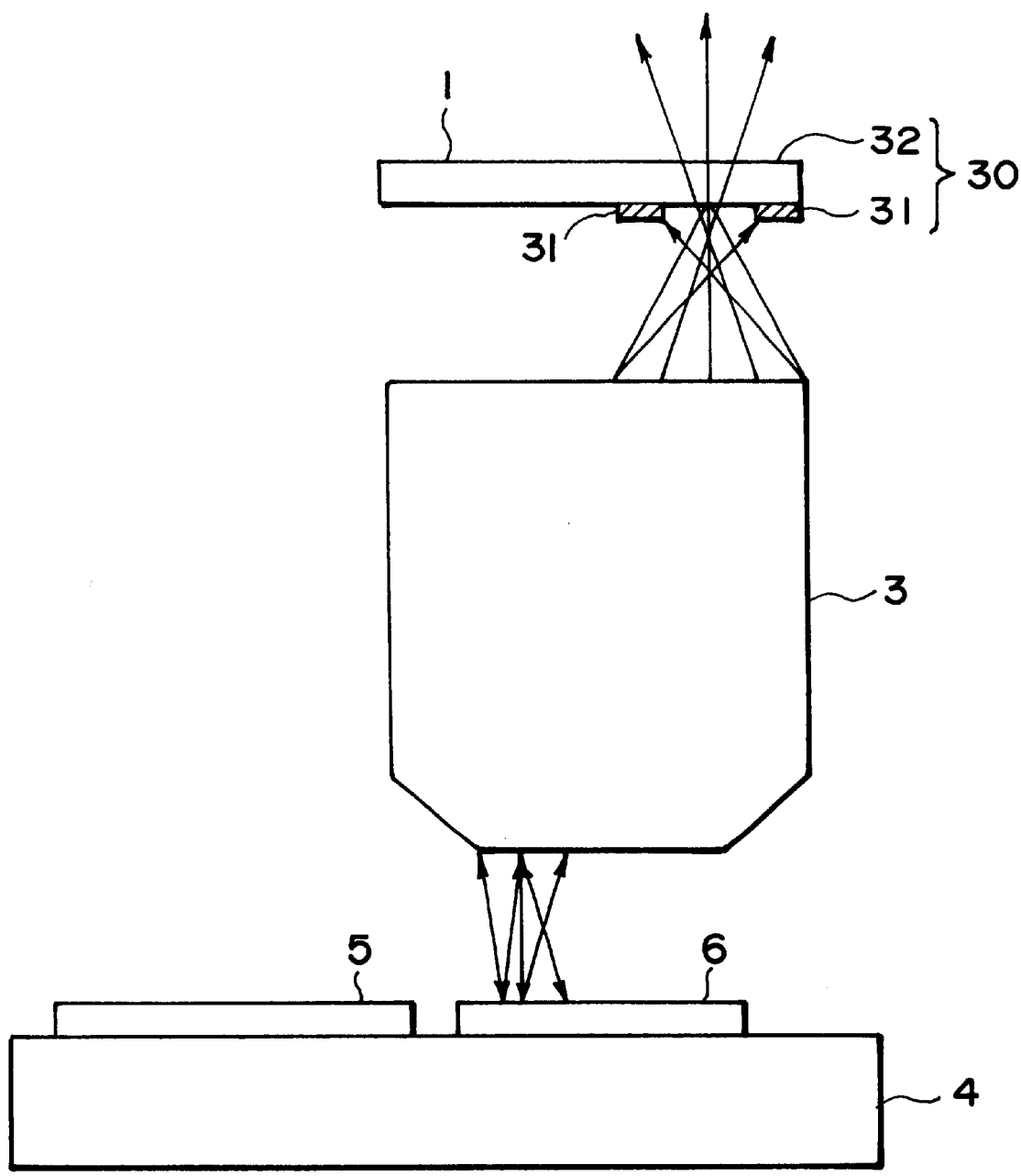
F I G. 3

EXPOSURE APPARATUS AND DEVICE MANUFACTURING METHOD

FIELD OF THE INVENTION AND RELATED ART

This invention relates to a projection exposure apparatus and a device manufacturing method using the same. More particularly, the invention is concerned with a projection exposure apparatus which is usable in the field of semiconductor device manufacture and which is called a stepper, having an autofocusing function for automatically adjusting the focus when a pattern of an original, such as a circuit pattern of a reticle, is projected and transferred to the surface of a substrate such as a semiconductor wafer in a reduced scale.

For semiconductor devices, LSI devices and VLSI devices, further miniaturization of the pattern and increasing density of integration have required a projection exposure apparatus having an imaging (projection) optical system with higher resolution. In this stream, the numerical aperture of imaging optical systems is being enlarged and the depth of focus thereof is being narrowed.

With regard to wafers, from the standpoint of flattening work, variation in thickness and warp to some extent have to be accepted. As regards correction of wafer warp, generally a wafer is placed on a wafer chuck having its surface machined with flatness of a submicron order, and the bottom face of the wafer is vacuum attracted whereby flatness correction is performed. However, as regards variation in thickness within a single wafer or deformation of wafers attributable to the wafer attracting method or resulting from wafer processes, flatness correction is difficult to achieve. Therefore, within a picture field to which a reticle pattern is to be projected, a wafer may have surface irregularities. This leads to further narrowing of the effective depth of focus of the optical system.

In reduction projection exposure apparatuses, therefore development of an automatic focusing method for effectively bringing the wafer surface into registration with the focal plane (image plane) of a projection optical system is one of important issues. Examples of a wafer surface position detecting method in a reduction projection exposure apparatus are a method using an air microsensor and a method (optical method) in which light is projected to a wafer surface in an oblique direction without passage through a projection exposure optical system and in which a positional deviation of reflected light is detected.

On the other hand, in projection exposure apparatuses, the focus position (image plane position) may shift due to a change in ambient temperature of a projection optical system, a change in atmospheric pressure, temperature rise caused by irradiation of the projection optical system with light, or temperature rise caused by heat generation in the structure including the projection optical system. This has to be corrected. To this end, a change in ambient temperature of atmospheric pressure is measured by using a detector, or a change in temperature or pressure in a portion of the projection optical system is measured by using a detector, and, on the basis of it, the focus position of the projection optical system is calculated and corrected, With this method, however, the focus position of the projection optical system is not directly measured. Therefore, there may be a detection error of the detector in the measurement of the temperature or pressure, a variation in temperature of a pressure, or an error in approximation calculation for calculating the focus position of the projection optical system. This obstructs high precision detection of the focus position of the projection optical system, Japanese Laid-Open Patent Application, Laid Open No. 105514/1990 discloses a Through-The-Lens autofocusing system (TTL-AF) wherein a focusing pattern provided an a reticle is irradiated with light of the same wavelength as exposure light and wherein, while moving an X-Y-Z stage having a predetermined reference flat mirror in an optical axis direction of a redaction projection lens in accordance with a step-and-repeat manner, the quantity of reflected light from the reference flat mirror and an output of a wafer surface position detecting system are measured at plural locations, such that the state of focus of the wafer surface is detected on the basis of the change in light quantity.

SUMMARY OF THE INVENTION

The above-described method, however, involves a problem that, since for each measurement point along the optical axis direction, the stage movement and the measurement have to be repeated to detect the focus state, it takes a long time to complete the focus state detection.

It is an object of the present invention to provide an improved exposure apparatus and/or device manufacturing method by which the image plane position of a projection optical system can be detected quickly so that the device productivity (throughput) can be enlarged significantly.

In accordance with an aspect of the present invention, there is provided an exposure apparatus, comprising: an original stage for supporting an original; a substrate stage for supporting a substrate; exposure illumination means for illuminating the original held by said original stage with exposure light; a projection optical system for projecting a pattern of the original illuminated by said exposure illumination means, onto the substrate held by said substrate stage; substrate position detecting means for detecting the position of the substrate with respect to an optical axis direction of said projection optical system; stage driving means for moving said substrate stage in the optical axis direction; focusing illumination means for illuminating a focusing mark provided on the original with light of substantially the same wavelength as that of the exposure light and for projecting, through said projection optical system, an image of the focusing mark onto a reflection surface provided at a predetermined position on said substrate stage; light receiving means for receiving light reflected by said reflection surface, through said projection optical system and the original; and focal plane detecting means for detecting the image plane position of said projection optical system on the basis of results of reception of light from the focusing mark image reflected by said reflection surface, at different positions along the optical axis direction; wherein said focal plane detecting means is operable, while continuously moving said substrate stage in the optical axis direction, to detect different positions of said reflection surface through cooperation with said substrate position detecting means and also to receive, at the different positions, the reflected light of the focusing mark image through said light receiving means. The focal plane detecting means may include synchronization means for synchronizing the detection of different positions of said reflection surface and the reception of reflected light at the respective positions.

With this arrangement, while the substrate stage is moved continuously along the optical axis direction, at different positions the reflection surface on the substrate stage is detected, and at these positions, the reflection light of the focusing mark image is received by the light receiving means. This enables high speed detection of the image plane position of the projection optical system and, thus, ensures improved device productivity (throughput).

When synchronization means for synchronizing the detection of the reflection surface at different positions and the reception of reflected light at these positions is provided, reception of reflection light can be performed at regular intervals and a precise sampling pitch. This enables high precision measurement of the image plane position.

A device manufacturing method according to the present invention may use an exposure apparatus such as described above, to perform aligning a substrate with respect to an image plane to be detected by focal plane detecting means, and to perform an exposure process to the substrate.

This procedure enables light reception while moving the substrate stage continuously without interruption at respective light receiving positions, and assures quick detection of the image plane position.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a schematic view for explaining reflection of light from a reference flat mirror in the structure of FIG. 1, on an occasion when the reference flat mirror and an image plane of a reduction projection lens are registered with each other.

FIG. 3 is a schematic view for explaining reflection of light from the reference flat mirror in the structure of FIG. 1, on an occasion when the reference flat mirror deviates from the image plane of the reduction projection lens.

DESCRIPTION OF THE PREFERRED EMBODIMENTS

Figure 1:
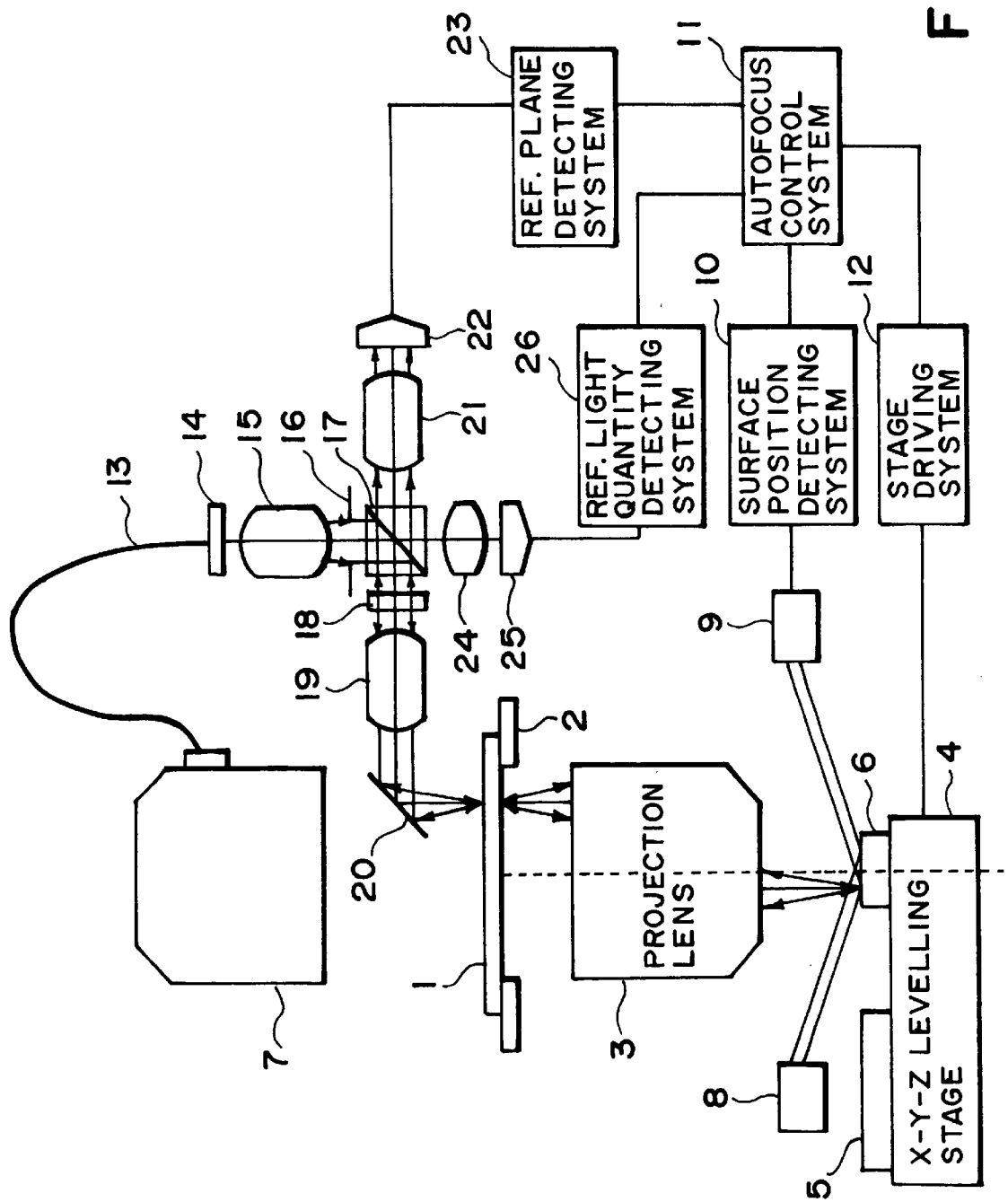
FIG. 1 is a schematic and diagrammatic view of a projection exposure apparatus with an automatic focus control system, according to an embodiment of the present invention.

FIG. 1 is a schematic and diagrammatic view of reduction projection exposure apparatus with an automatic focus control system, according to an embodiment of the present invention. Denoted at 1 in the drawing is a reticle (photomask) which is held by a reticle stage 2. A circuit pattern formed on the reticle 1 can be imaged, in a reduced scale of 1:5, by a reduction projection lens 3 onto a wafer 5 which is placed on an X-Y-Z stage 4, whereby exposure of the same is performed. Disposed adjacent to the wafer 5 is a reference flat mirror 6 having its mirror surface placed substantially at the same level as the wafer 5 surface. The mirror surface of the reference flat mirror 6 is formed of a metal film such as Cr or Al, for example. The X-Y-Z stage 4 is movable in an optical axis direction (Z direction) of the reduction projection lens 3 as well as along a plane (X-Y plane) perpendicular to this direction. As a matter of course, it can be rotated about the optical axis. For transfer of the circuit pattern to the wafer 5, an illumination optical system 7 illuminates the circuit pattern of the reticle 1 within its picture field, which is to be transferred.

Denoted at 8 and 9 are a light projecting optical system and a detection optical system, respectively, which are components of an off-axis surface position detecting optical system. The light projecting optical system 8 projects plural light beams. Each of the light beams projected by the light projecting optical system 8 comprises non-exposure light, that is, light to which a photoresist on the wafer 5 is not sensitive. These light beams are collected on the reference flat mirror 6 (or the upper surface of the wafer 5), and they are reflected thereby. The light reflected by the reference flat mirror 6 enters the detection optical system 9. While not shown in the drawing, the detection optical system 9 includes a plurality of light receiving elements, for position detection, which are operationally associated with plural reflection light beams to be detected, respectively. These light receiving elements for position detection are so disposed that the light receiving surface of each element is substantially optically conjugate with the reflection point of a corresponding light upon the reference flat mirror 6, with respect to an imaging optical system. Thus, any positional deviation of the reference flat mirror 6 in the optical axis direction of the reduction projection lens 3 can be measured as a positional displacement of incident light upon the position detecting light receiving element of the detection optical system.

The positional deviation of the reference flat mirror 6 from a predetermined reference plane as measured by the detection optical system is then calculated as the surface position by means of a surface position detecting system 10, which is operable on the basis of output signals from the position detecting light receiving elements. Then, a corresponding signal is applied to an autofocus control system 11 through a signal line. The autofocus control system 11 supplies a control signal to a stage driving device 12 through a signal line, for moving the X-Y-Z stage 4 to which the reference flat mirror 6 is fixed. Also, for detection of the focus position of the projection lens 3 in accordance with a TTL (through-the-lens) method, the autofocus control system 11 supplies a control signal to the stage driving device 12 to move the X-Y-Z stage 4 so that the reference flat mirror 6 is displaced upwardly/downwardly along the optical axis direction (Z direction) of the projection lens 3, about a predetermined reference position. Here, the autofocus control system 11 is operable to apply a synchronization pulse signal to the surface position detecting system 10 to detect the surface position and, additionally, on the basis of this synchronization pulse signal, to analog-to-digital convert an analog output signal of a focal plane detecting system 23 for the sampling, to be described late. Further, in this embodiment, the position control of the wafer 5 within the X-Y plane for the exposure operation can also be performed by using the autofocus control system 11 and the stage driving device 12.

Referring now to FIGS. 2 and 3, the focus position detecting optical system for the reduction projection lens 3 will be described. Denoted in FIGS. 2 and 3 at 1 is a reticle, and denoted at 31 are pattern portions defined on the reticle 1. The pattern portions 31 have a light blocking property, in this example. Denoted at 32 is a light transmitting portion sandwiched between the pattern portions 31. The pattern portions 31 and the light transmitting portion 32 define a focusing mark 30. Here, for detection of the focus position (image plane position) of the reduction projection lens 3, as described, the X-Y-Z stage 4 is moved continuously along the optical axis direction of the reduction projection lens 3. The reference flat mirror 6 is positioned just below the reduction projection lens 3, and the pattern portions 31 and the light transmitting portion 32 of the reticle 1 are illuminated by an autofocusing illumination optical system to be described later.

First, an example wherein the reference flat mirror 6 is at the focal plane of the reduction projection lens 3 will be described, in conjunction with FIG. 2. Light passing through the light transmitting portion 32 of the reticle 1 is collected through the reduction projection lens 3 onto the reference flat mirror 6, and it is reflected thereby. The reflected light goes back along its oncoming path, and it is collected through the reduction projection lens 3 onto the reticle 1. It passes through the light transmitting portion 32 between the pattern portions 31 of the reticle 1. Here, the light is not eclipsed by the pattern portions 31 of the reticle 1, and the whole light can pass through the light transmitting portion 32 between the pattern portions, 31.

Next, a case where the reference flat mirror 6 is at a position deviated from the focal plane of the reduction projection lens 3 will be described, in conjunction with FIG. 3. Light passing through the light transmitting portion 32 of the pattern portions 31 the reticle 1 goes through the reduction projection lens 3 and reaches the reference flat mirror 6. Since, however, the reference flat mirror 6 is not at the focal plane of the reduction projection lens 3, the light reflected by the reference flat mirror 6 is diverged. Thus, the reflected light goes back along a path different from its oncoming path, and passes the reduction projection lens 3. Then, without being collected an the reticle 1, the light impinges on the reticle 1 as light having expansion corresponding to the amount of deviation of the reference flat mirror 6 from the focal plane of the reduction projection lens 3. Here, a portion of the light is eclipsed by the pattern portions 31 of the reticle 1, such that the whole light cannot pass through the light transmitting portion 32. Namely, between cases of registration and misregistration with respect to the focal surface, there is a difference in the quantity of reflected light passing through the reticle 1.

Referring back to FIG. 1, an illumination system and a light receiving system of the focus position detecting optical system will be described. In the illumination system, a light guiding fiber 13 extracts light of the same wavelength as that of the exposure light, from the exposure illumination system 7. By means of a chopper (shutter) 14, the light emitted from an end of the fiber 13 is intermittently (as pulse light) applied to a relay lens 15. Then, the light goes through a stop 16 and enters a polarization beam splitter 17, whereby only light of an S-polarization component is reflected. Then, the light goes via a quarter waveplate 18, an objective lens 19 and a switching mirror 20, and it illuminates a portion about a focusing mark 30 of the reticle 1. The stop 16 functions as a pupil of this illumination system and serves to determine the effective light source of the illumination system. Also, the position of the stop 16 is set to be optically conjugate with the pupil of the projection lens 3.

Next, the light receiving system will be described. As described with reference to FIGS. 2 and 3, the reflected light from the reference flat mirror 6 coming back through the reticle 1 goes via the switching mirror 20 and the objective lens 19, and it impinges on the quarter waveplate 18. By the passage through this quarter waveplate 18, the reflected light is transformed into P-polarized light so that it passes through the polarization beam splitter 17. Then, it goes through a relay lens 21 and impinges an a light receiving element 22, provided at a position optically conjugate with the pupil of the projection lens 3. In response, the light receiving element 22 detects the quantity of light. Here, the polarization beam splitter 17 and the quarter waveplate 18 function to increase the light utilization efficiency.

Here, if direct reflection light (non-signal light) from the reticle 1, other than the reflected light from the reference flat mirror 6, impinges on the light receiving element 22, the reticle reflected light generates flare to decrease the signal-to-noise ratio. Since, in this embodiment, however, the projection lens 3 is telecentric only on the wafer side and it is not telecentric on the reticle side, the incidence angle to the reticle 1 is not a right angle. Therefore, the direct reflection light from the reticle 1 does not go back and enter the light receiving element 22. If the projection lens 3 is telecentric both on the reticle side and on the wafer side, the quarter waveplate 18 may be disposed, not at the position illustrated, but between the reticle 1 and the X-Y-Z stage 4, for example, inside the projection lens 3. On that occasion, light directly reflected by the reticle 1 can be blocked by the polarization beam splitter 17 and prevented from impinging on the light receiving element 22, such that only reflection light from the reference flat mirror 6 can be directed to the light receiving element 22 through the projection lens 3, whereby the signal-to noise ratio can be improved.

In FIG. 1, denoted at 24 and 25 are components of the focus position detecting system, for monitoring the light quantity, wherein denoted at 24 is a condenser lens and denoted at 25 is a light receiving element. As described hereinbefore, an S-polarization component of the light emitted from the light guiding fiber 13 is reflected by the polarization beam splitter 17 and it illuminates the focusing mark 30, while the remaining P-polarized component goes through the polarization beam splitter 17. The thus transmitted light is collected by the condenser lens 24 onto the light receiving element 25. The light receiving element 25 supplies a signal, corresponding to the intensity of the thus received light, to a reference light quantity detecting system 26 through a signal line. Thus, assuming that the light from the fiber 13 has a random polarization characteristic, the signal from the light receiving element 25 is variable in proportion to a change in the quantity of light from the fiber 13.

Figure 4:
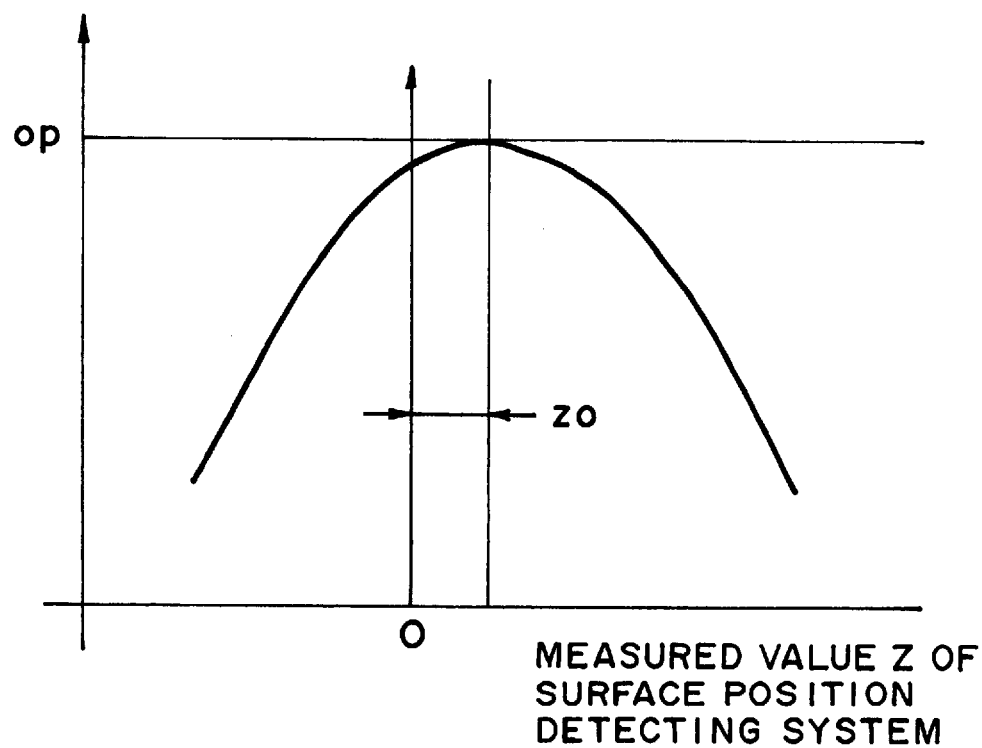
FIG. 4 is a graph for explaining the relation between an output signal of a focal plane detecting system and a measured value of a surface position detecting system in the structure of FIG. 1.
Figure 5:
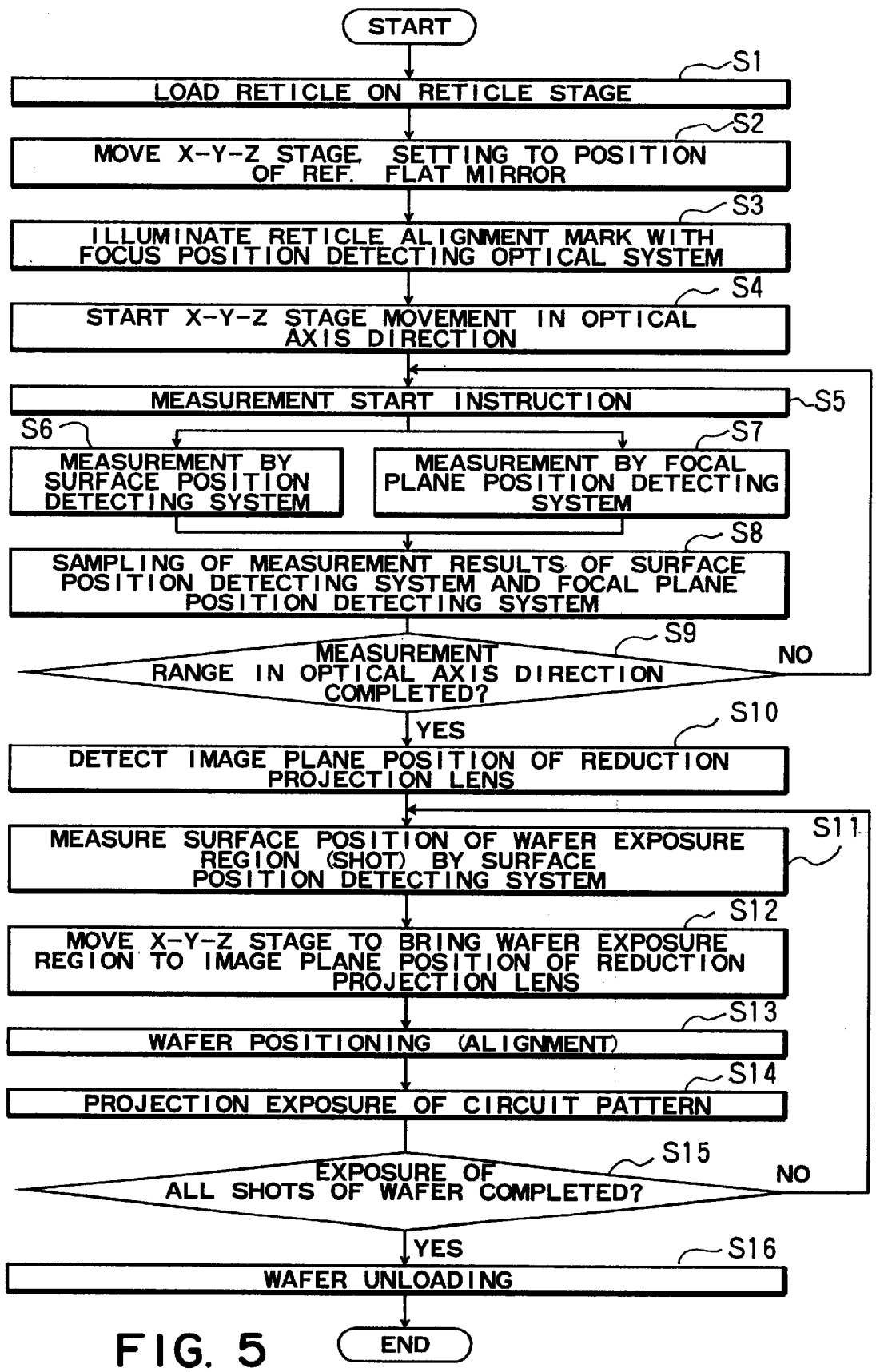
FIG. 5 is a flow chart for explaining an example of a sequence from focal plans detection to exposure.

FIG. 5 is a flow chart for explaining sequential operations for detecting the focus position (image plane position) of the reduction projection lens 3 on the basis of an output signal from the light receiving element 22 and then for performing the exposure process. As illustrated, in response to a start of the exposure operation, a reticle 1 is loaded and the position of the reference flat mirror 6 is set (steps S1 and S2). After this, the focus position detecting optical system operates to illuminate the focusing mark 30 (step S3), and the stage driving device 12 operates to continuously move the X-Y-Z stage 4 carrying the reference flat mirror 6 in the optical axis direction of the reduction projection lens 3, so that the stage is moved at a constant speed about zero as predetermined by the out-axis surface position detecting system 9 (step S4). During this period, the focus control system 11 applies a synchronization pulse signal to the surface position detecting system 10, by which an output signal z related to the position of the reference flat mirror 6 with respect to the optical axis direction is produced. Simultaneously therewith, by using the same synchronization pulse signal, the output signal o which is produced by the focal plane detecting system 23 in response to reception of reflected light from the reference flat mirror 6 by the light receiving element 22, is sampled (steps S5–S9). FIG. 4 illustrated the relation between the thus produced output signal o and output signal z.

In this embodiment, in order to avoid the influence of fluctuation (light quantity variation) of a light source such as a Hg lamp of the exposure illumination system 7, the signal from the focal plane detecting system 23 is standardized with respect to a signal from the reference light quantity detecting system 26 described above. Also, in order to reduce the influence of shot noise of the light receiving element 22, the light from the fiber 13 is blocked by the chopper 14 at a particular period so as to illumination the focusing mark 30 intermittently while, an the other hand, signals are produced in the focal surface detecting system 23 in synchronism with that period. To achieve this operation, the chopper 14 is electrically communicated with the autofocus control system 11 through a signal line (not shown), so that the autofocus control system 11 performs synchronization control for the chopper 14 and the focal surface detecting system 23. This can be accomplished by applying driving clocks of a predetermined frequency to the focal plane detecting system 23 and driving means (not shown) of the chopper 14, from a timing circuit of the autofocus control system 11.

Referring back to FIG. 4, when the reference flat mirror 6 is positioned at the focal plane (image plane) of the reduction projection lens 3, the output of the focal plane detecting system 23 shows its peak value op. The amount of deviation zo, from the zero point as preset by the off-axis surface position detecting system 9, is taken as the focus position of the projection optical system for performing an exposure process to a wafer 5 by use of the reduction projection lens 3 (step S10).

After the image plane position of the projection lens 3 is detected as described above, the X-Y-Z stage is moved in accordance with the result of the detection so that an exposure region of the wafer 5 is placed at the image plane position of the reduction projection lens 3, and exposure of the wafer 5 is performed (steps S11–S15). When exposures of all shots are completed, the wafer 5 is unloaded (step S16), and the exposure operation is accomplished.

In the exposure operation described above, the image plane position of the reduction projection lens 3 is detected for every single wafer. However, as a matter of course, it may be made for every shot or every few wafers.

As described hereinbefore, the light having passed through the reticle 1 and the projection lens 3 (both to be used for practical pattern transfer) is used as detection light with which the focus position of the projection lens 3 is measured directly. In addition, the position of the wafer 5 to which a pattern is to be transferred is detected separately by using the off-axis surface position detecting system 9. By correlating these detections, the wafer 5 to which a pattern is to be transferred can always be positioned at the focal plane of the projection lens 3.

In accordance with this embodiment, the focal plane (image plane) of the reduction projection lens 3 is measured while scanningly moving the X-Y-Z stage 4 in the optical axis direction. This removes the necessity of a repeated positioning operation (acceleration, deceleration and stoppage) of the X-Y-Z stage in the optical axis direction, and therefore, it assures focus plane measurement in reduced time. Thus, the productivity or throughput of the apparatus can be enlarged significantly.

Further, since a repeated positioning operation of the X-Y-Z stage in the optical axis direction for measurement of the focus plane (image plane) of the projection lens 3 is unnecessary, measurements can be done at regular intervals and precise sampling pitch without being influenced by the precision of this repeated positioning operation. It enables high precision measurement of the image plane position.

Next, an embodiment of a semiconductor device manufacturing method which uses a projection exposure apparatus such as described above, will be explained.

Figure 6:
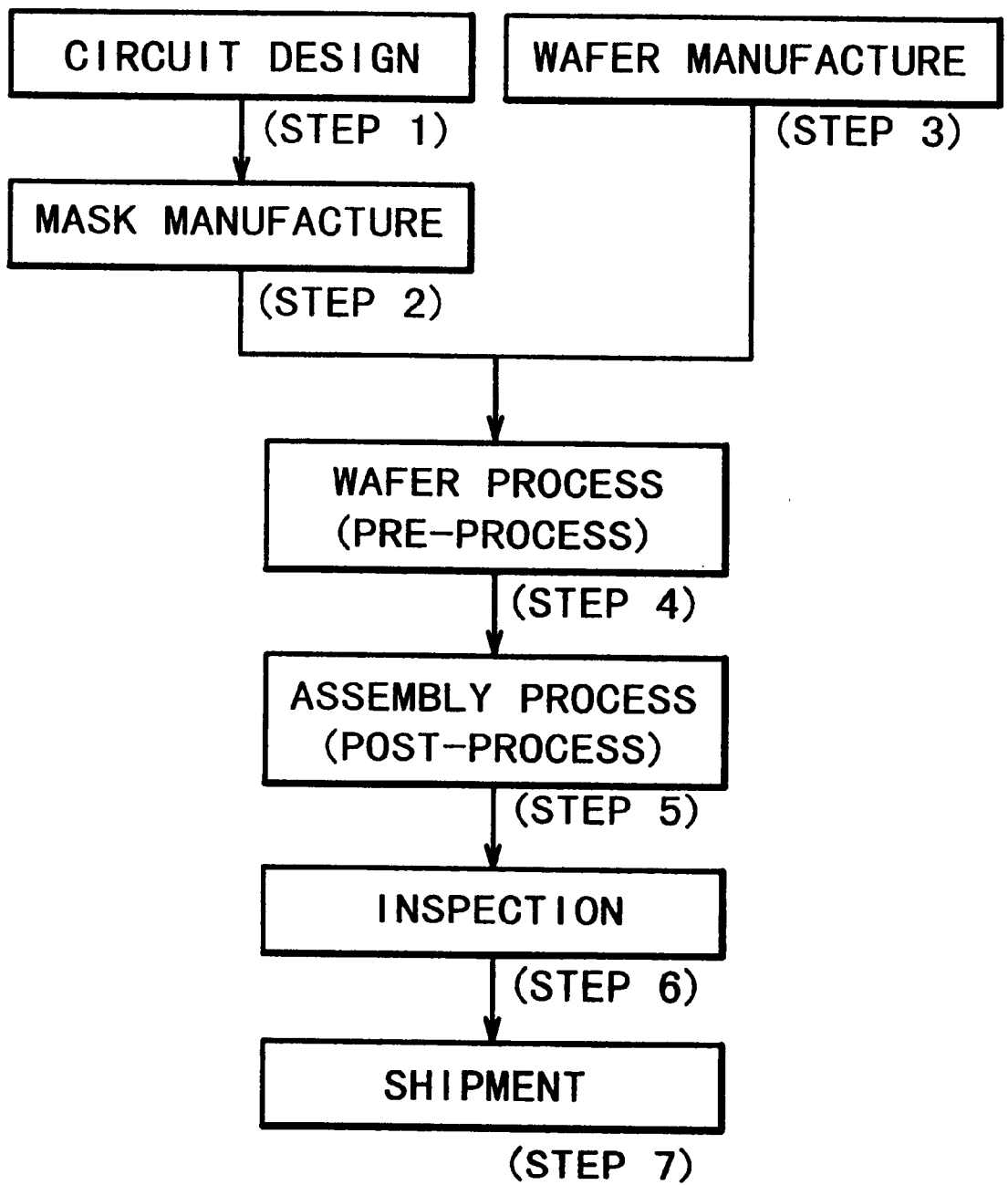
FIG. 6 is a flow chart for explaining an example of a device manufacturing procedure to be made by use of an apparatus or a method according to the present invention.

FIG. 6 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 7:
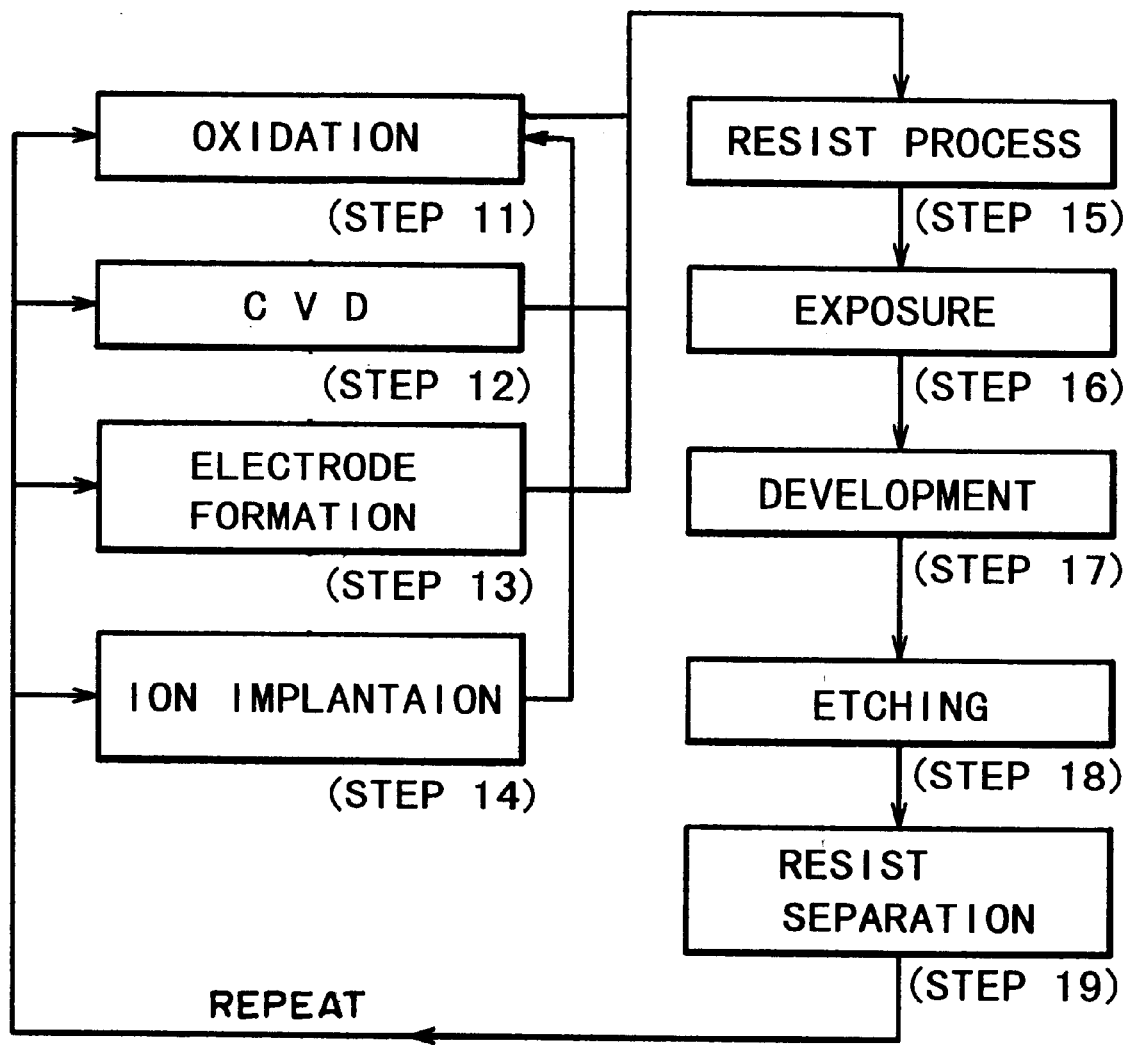
FIG. 7 is a flow chart for explaining details of a wafer process in the procedure of FIG. 6.

FIG. 7 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:

an original stage for supporting an original;

a substrate stage for supporting a substrate;

exposure illumination means for illuminating the original held by said original stage with exposure light;

a projection optical system for projecting a pattern of the original illuminated by said exposure illumination means, onto the substrate held by said substrate stage;

substrate position detecting means for detecting the position of the substrate with respect to an optical axis direction of said projection optical system;

stage driving means for moving said substrate stage in the optical axis direction;

focusing illumination means for illuminating a focusing mark provided on the original with light of substantially the same wavelength as that of the exposure light and for projecting, through said projection optical system, an image of the focusing mark onto a reflection surface provided at a predetermined position on said substrate stage;

light receiving means for receiving light reflected by the reflection surface, through said projection optical system and the original;

focal plane detecting means for detecting the image plane position of said projection optical system on the basis of results of reception of light from the focusing mark image reflected by said reflection surface, at different positions along the optical axis direction, wherein said focal plane detecting means is operable, while said substrate stage is continuously moved in the optical axis direction, to detect different positions of the reflection surface through cooperation with said substrate position detecting means and also to receive, at the different positions, the reflected light of the focusing mark image through said light receiving means; and synchronization means for synchronizing the position detection through said substrate position detecting means and the light reception through said light receiving means.

2. A device manufacturing method usable with an exposure apparatus as recited in claim 1, for aligning a substrate with respect to an image plane by use of focal plane detecting means as recited in claim 1 and for performing an exposure process to the substrate.

3. An exposure apparatus, comprising:

a projection optical system;

a reflection member;

a first light receiving device for receiving first reflection light reflected by said reflection member to detect a position of said reflection member with respect to an optical axis direction of said projection optical system;

a second light receiving device for receiving second reflection light reflected by said reflection member to detect a position of said reflection member with respect to an image plane of said projection optical system;

moving means for continuously moving said reflection member in the optical axis direction in a period in which the first reflection light is received by said first light receiving device while the second reflection light is received by said second light receiving device;

position detecting means for detecting the position of the image plane on the basis of the first reflection light received by said first light receiving device and the second reflection light received by said second light receiving device; and synchronization means for synchronizing the position detection by said position detecting means and the light reception by said first and second light receiving devices.

4. An apparatus according to claim 3, wherein said moving means moves said reflection member without interruption, in the period in which the first reflection light is received by said first light receiving device while the second reflection light is received by said second light receiving device.

5. An apparatus according to claim 4, further comprising a first detector for detecting the position of said reflection member in the optical axis direction on the basis of an output of said first light receiving device, and a second detector for detecting the position of said reflection member with respect to the image plane on the basis of an output of said second light receiving device, wherein said first and second detectors perform plural detections while said reflection member is moved.

6. An apparatus according to claim 5, wherein said first and second detectors perform plural detections while said reflection member is moved at a constant speed.

7. An apparatus according to claim 6, wherein said projection optical system projects a pattern of an original onto a substrate in response to illumination of the original with exposure light, the second reflection light has the same wavelength as that of the exposure light, and said first detector detects the position of the substrate with respect to the optical axis direction.

8. An exposure method, comprising the steps of:

projecting light to a reflection member and receiving, with a first light receiving device, first reflection light reflected by the reflection member to detect a position of the reflection member with respect to an optical axis direction of a projection optical system;

projecting light to the reflection member and receiving, with a second light receiving device, second reflection light reflected by the reflection member to detect a position of the reflection member with respect to an image plane of the projection optical system;

continuously moving the reflection member in the optical axis direction in a period in which the first reflection light is received by the first light receiving device while the second reflection light is received by the second light receiving device;

detecting the position of the image plane on the basis of the first reflection light received by the first light receiving device and the second reflection light received by the second light receiving device; and synchronizing the position detection in the position detecting step and the light reception by the first and second light receiving devices in the light projecting steps.

9. A method according to claim 8, wherein the reflection member is moved without interruption, in the period in which the first reflection light is received by the first light receiving device while the second reflection light is received by the second light receiving device.

10. A method according to claim 9, further comprising providing a first detector for detecting the position of the reflection member in the optical axis direction on the basis of an output of the first light receiving device, and providing a second detector for detecting the position of the reflection member with respect to the image plane on the basis of an output of the second light receiving device, wherein the first and second detectors perform plural detections while the reflection member is moved.

11. A method according to claim 10, wherein the first and second detectors perform plural detections while the reflection member is moved at a constant speed.

12. A method according to claim 11, further comprising projecting, by the projection optical system a pattern of an original onto a substrate in response to illumination of the original with exposure light, wherein the second reflection light has the same wavelength as that of the exposure light, and detecting, by the first detector, the position of the substrate with respect to the optical axis direction.

13. An exposure apparatus, comprising:

a projection optical system;

a reflection member;

substrate position detecting means for detecting the position of a substrate with respect to an optical axis direction of said projection optical system;

a light receiving device for receiving reflection light reflected by said reflection member to detect a position of said reflection member with respect to an image plane of said projection optical system;

moving means for continuously moving said reflection member in the optical axis direction in a period in which said substrate position detecting means detects the position of the substrate while the reflection light is received by said light receiving device;

position detecting means for detecting the position of the image plane on the basis of the position of the substrate detected by said position detecting means and the reflection light received by said light receiving device; and synchronization means for synchronizing the position detection by said position detecting means and the operation of said position detecting means and said light receiving device.

14. An exposure method, comprising the steps of:

projecting light to a reflection member and receiving, with substrate position detecting means, first reflection light reflected by the reflection member to detect a position of the reflection member with respect to an optical axis direction of a projection optical system;

projecting light to the reflection member and receiving, with a light receiving device, second reflection light reflected by the reflection member to detect a position of the reflection member with respect to an image plane of the projection optical system;

continuously moving the reflection member in the optical axis direction in a period in which the first reflection light is received by the substrate position detecting means while the second reflection light is received by the light receiving device;

detecting the position of the image plane on the basis of the first reflection light received by the substrate position detecting means and the second reflection light received by the light receiving device; and synchronizing the position detection in the position detecting step and the light reception by the substrate position detecting means and the light receiving device in the light projecting steps.

15. A device manufacturing method comprising:

providing a projection optical system;

providing a reflection member;

receiving, by a first light receiving device, first reflection light reflected by the reflection member to detect a position of the reflection member with respect to an optical axis direction of the projection optical system;

receiving, by a second light receiving device, second reflection light reflected by the reflection member to detect a position of the reflection member with respect to an image plane of the projection optical system;

continuously moving, by moving means, the reflection member in the optical axis direction in a period in which the first reflection light is received by the first light receiving device while the second reflection light is received by the second light receiving device;

detecting the position of the image plane on the basis of the first reflection light received by the first light receiving device and the second reflection light received by the second light receiving device; and synchronizing the position detection by the position detecting means and the light reception by the first and second light receiving devices.

16. A device manufacturing method comprising:

providing a projection optical system;

providing a reflection member;

detecting, by surface position detecting means, the position of a substrate, with respect to an optical axis direction of the projection optical system;

receiving, by a light receiving device, reflection light reflected by the reflection member to detect a position of the reflection member with respect to an image plane of the projection optical system;

continuously moving, by moving means, the reflection member in the optical axis direction in a period in which the substrate position detecting means detects the position of the substrate while the reflection light is received by said light receiving device;

detecting the position of the image plane on the basis of the position of the substrate detected by said position detection means and the reflection light received by the light receiving device; and synchronizing the position detection by the position detecting means and the operation of the position detecting means the light receiving device.

* * * * *

UNITED STATES PATENT AND TRADEMARK OFFICE
CERTIFICATE OF CORRECTION

PATENT NO. : 6,281,966 B1
DATED : August 28, 2001
INVENTOR(S) : Hiromi Kenmoki et al.

Page 1 of 1

It is certified that error appears in the above-identified patent and that said Letters Patent is hereby corrected as shown below:

Drawings,
FIG. 7, in "(STEP 14)", "IMPLANTAION" should read -- IMPLANTATION --.

Column 1,
Line 41, "of" (first occurrence) should read -- of the --; and
Line 66, "of a" should read -- or --.

Column 2,
Line 9, "redaction" should read -- reduction --.

Column 4,
Line 56, "late." should read -- later. --.

Column 7,
Line 14, "illumination" should read -- illuminate --.

Signed and Sealed this

Second Day of April, 2002

Attest:

JAMES E. ROGAN
*Attesting Officer*   *Director of the United States Patent and Trademark Office*